US009768680B2

(12) United States Patent
Bojarski et al.

(10) Patent No.: US 9,768,680 B2
(45) Date of Patent: Sep. 19, 2017

(54) POWER CONVERTER HAVING EMI FILTER COMMON TO MULTIPLE CONVERTERS

(71) Applicant: The Boeing Company, Chicago, IL (US)

(72) Inventors: Mariusz Bojarski, Bronx, NY (US); Kerim Colak, Brooklyn, NY (US); Dazhong Gu, Brooklyn, NY (US); Duanyang Wang, Mountain View, CA (US); Qingquan Tang, Kingston, PA (US); Dariusz Czarkowski, South Setauket, NY (US); Francisco de Leon, Ridgewood, NJ (US); Kamiar J. Karimi, Kirkland, WA (US); Shengyi Liu, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 974 days.

(21) Appl. No.: 14/034,066

(22) Filed: Sep. 23, 2013

(65) Prior Publication Data
US 2015/0021994 A1 Jan. 22, 2015

Related U.S. Application Data

(63) Continuation-in-part of application No. 13/945,511, filed on Jul. 18, 2013, now Pat. No. 9,091,227.

(51) Int. Cl.
H02M 1/44 (2007.01)
H03H 7/42 (2006.01)
H02M 3/158 (2006.01)

(52) U.S. Cl.
CPC ............. *H02M 1/44* (2013.01); *H03H 7/427* (2013.01); *H02M 2003/1586* (2013.01); *Y10T 307/406* (2015.04)

(58) Field of Classification Search
CPC .................................. H02M 1/44; H03H 7/427
See application file for complete search history.

(56) References Cited

U.S. PATENT DOCUMENTS 5,179,362 A * 1/1993 Okochi .................. H04B 15/02
333/12
6,154,381 A * 11/2000 Kajouke .................. B60L 1/00
363/65

(Continued)

OTHER PUBLICATIONS

Likely, "achieving emc for dc-dc converter," Feb. 2, 2003, EMC Tasu compliance journal, pp. 1-4.*

*Primary Examiner* — Thienvu Tran
*Assistant Examiner* — Pinping Sun
(74) *Attorney, Agent, or Firm* — Kunzler Law Group, PC

(57) ABSTRACT

A power supply system is disclosed that includes a first interleaved power supply, a second interleaved power supply, and a common electromagnetic interference filter. The common electromagnetic interference filter is configured to provide DC power from a DC power source to both the first interleaved power supply and the second interleaved power supply. In one example, the common electromagnetic interference filter comprises a localized filter stage configured to receive DC power from the DC power source, and a distributed filter stage configured to receive DC power from the localized filter stage. The distributed filter stage includes a first set of common mode capacitors electrically connected to and physically proximate input power lines of the first interleaved power supply, and a second set of common mode capacitors electrically connected to and physically proximate input power lines of the second interleaved power supply.

15 Claims, 5 Drawing Sheets

(56) References Cited

U.S. PATENT DOCUMENTS

| | | | | |
|---|---|---|---|---|
| 6,198,642 B1* | 3/2001 | Kociecki | ............ | H02M 1/4225 |
| | | | | 307/150 |
| 7,095,636 B2* | 8/2006 | Sarlioglu | ............ | H02M 1/126 |
| | | | | 363/39 |
| 7,859,874 B2* | 12/2010 | Bovitz | ............ | H02M 1/10 |
| | | | | 307/75 |
| 7,872,886 B2* | 1/2011 | Xu | ............ | H02M 3/1584 |
| | | | | 307/77 |
| 8,030,788 B2* | 10/2011 | Xu | ............ | F01D 15/10 |
| | | | | 290/31 |
| 8,279,633 B2* | 10/2012 | Ye | ............ | H02M 3/33569 |
| | | | | 363/21.02 |
| 8,300,438 B1* | 10/2012 | Herbert | ............ | H02M 1/4216 |
| | | | | 363/124 |
| 8,792,253 B2* | 7/2014 | Wang | ............ | H02M 3/33507 |
| | | | | 323/272 |
| 2005/0128666 A1* | 6/2005 | Pogodayev | ............ | H05B 41/245 |
| | | | | 361/58 |
| 2008/0111420 A1* | 5/2008 | Anghel | ............ | H02J 4/00 |
| | | | | 307/9.1 |
| 2011/0122662 A1* | 5/2011 | Li | ............ | H02M 1/32 |
| | | | | 363/49 |
| 2012/0232728 A1* | 9/2012 | Karimi | ............ | H02J 3/38 |
| | | | | 701/22 |
| 2013/0049918 A1* | 2/2013 | Fu | ............ | H01F 3/12 |
| | | | | 336/220 |

* cited by examiner

POWER CONVERTER HAVING EMI FILTER COMMON TO MULTIPLE CONVERTERS

CROSS-REFERENCE TO RELATED APPLICATIONS

The present application is a continuation-in-part of U.S. Ser. No. 13/945,511, filed Jul. 18, 2013, and entitled "AIRCRAFT UNIVERSAL POWER CONVERTER," which is hereby incorporated by reference.

BACKGROUND

Using low-voltage, unregulated DC output power from fuel cells or other unregulated power sources in distributed power systems, particularly for aircraft, is an emerging technology. Current aircraft power system use a centralized power generation system, such as engine driven generators, with typical voltages of 115 VAC or 230 VAC. Emergency backup power sources of the aircraft may use low-voltage batteries.

Fuel cells may be used as auxiliary electric power sources on aircraft to deliver localized and/or peak power. They may also be used as a source of emergency power. However, a fuel cell provides an unregulated DC voltage which varies with the load by as much as 50% from low-load to full-load operation. Therefore, fuel cells alone are not a valid substitute for the engine driven generators used in current aircraft since they are incapable of providing various levels and configurations of DC and AC voltages.

One solution for adapting a fuel cell to generate various levels and configurations of DC and AC voltages includes the use of DC/DC converters and inverters. One such solution is shown in the U.S. Ser. No. 13/945,511, filed Jul. 18, 2013, and entitled "AIRCRAFT UNIVERSAL POWER CONVERTER." In order to meet various system requirements, such as those mandated for use by the aircraft industry, electromagnetic interference (EMI) filters are typically required for each converter. However, the size and weight of the power system may undesirably increase with the addition of each EMI filter.

SUMMARY

A power supply system is disclosed that includes a first interleaved power supply, a second interleaved power supply, and a common electromagnetic interference filter. The common electromagnetic interference filter is configured to provide DC power from a DC power source to both the first interleaved power supply and the second interleaved power supply. In one example, the common electromagnetic interference filter comprises a localized filter stage configured to receive DC power from the DC power source, and a distributed filter stage configured to receive DC power from the localized filter stage. The distributed filter stage includes a first set of common mode capacitors electrically connected to and physically proximate input power lines of the first interleaved power supply, and a second set of common mode capacitors electrically connected to and physically proximate input power lines of the second interleaved power supply.

DETAILED DESCRIPTION

Figure 1:
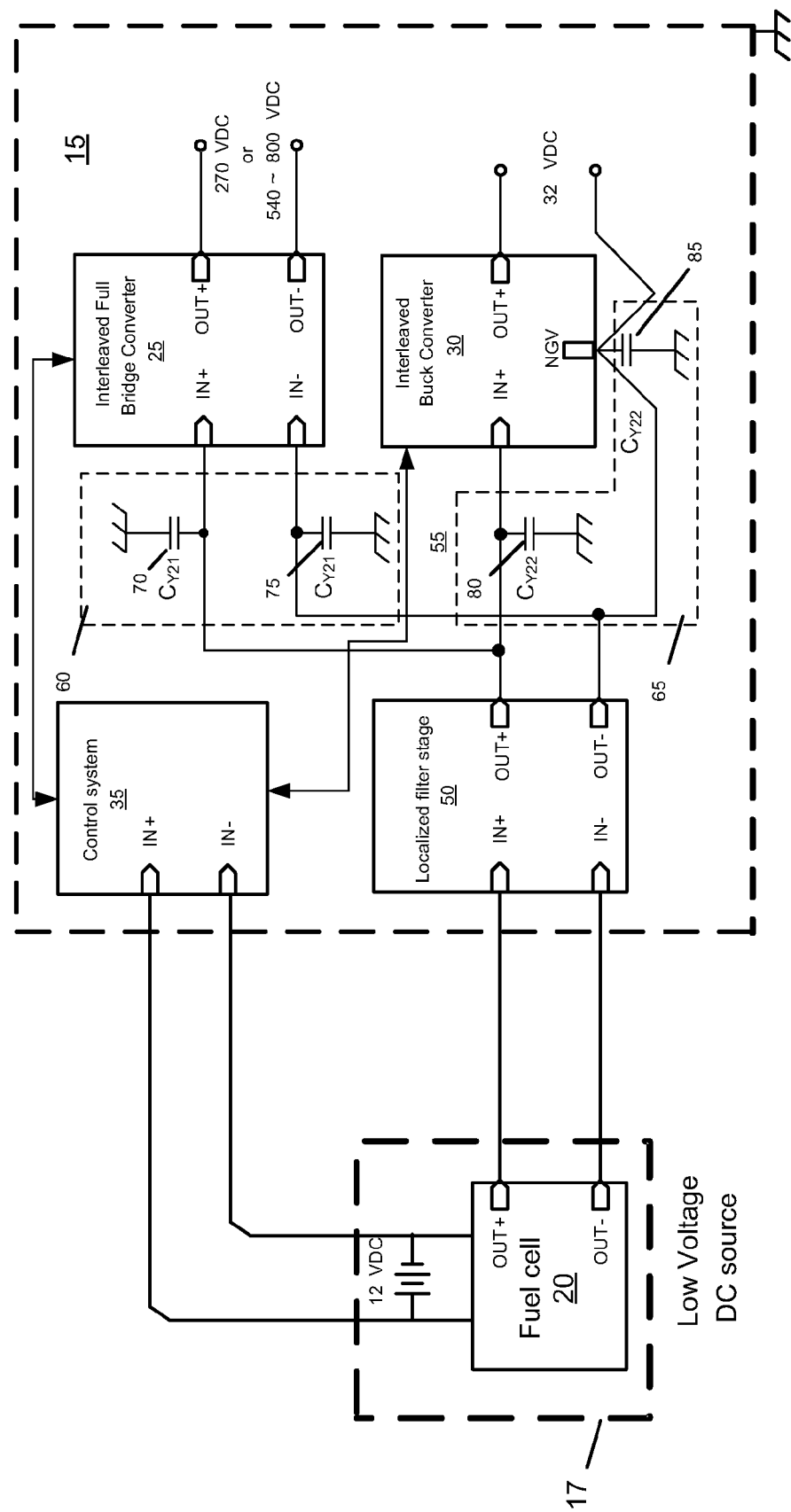
FIG. 1 is a block diagram of a power system suitable for an aircraft, where the power system includes a common electromagnetic interference filter (EMI) configured to provide DC power from a DC power source to multiple interleaved power supplies.

FIG. 1 is a block diagram of a power system 10 suitable for an aircraft. The power system 10 is not limited to aircraft, however, and may be used in a variety of environments in which an unregulated DC power source is used to generate one or more regulated AC and DC power outputs.

In the power system 10 of FIG. 1, a power converter 15 is configured to receive DC power from a low-voltage DC source 17. The low-voltage DC source 17 provides unregulated DC power from a DC power source, such as a fuel cell 20. Such fuel cells often provide an unregulated DC voltage of between 35-60 $V_{DC}$. The power converter 15 may be formed from a plurality of individual conversion units integrated as a single power supply conversion unit.

The power converter 15 is configured to convert unregulated low-voltage DC output power provided by the DC power source, such as a fuel cell 20, to a plurality of regulated aircraft voltages, including AC and/or DC voltage outputs. Here, high-voltage DC power is provided at the output of a first interleaved converter. In FIG. 1, the first interleaved converter is an interleaved full-bridge converter 25 having X phases, where, for example, X=4. In an aircraft, the high-voltage DC may have multiple DC voltage levels. For example, the high-voltage DC may be at a level of $+/-V_{DC}$ with respect to a common level. Various aircraft use voltage levels of approximately $+/-270$ $V_{DC}$. Or the high-voltage DC may be at a voltage level between about 540-800 $V_{DC}$ end-to-end without reference to the common level. The high-voltage DC at the output of the interleaved full-bridge converter 25 is distributed to other portions of the aircraft on a high-voltage DC power bus.

Low-voltage DC power is provided at the output of a second interleaved converter 30 having Y phases, where, for example, Y=6 In the example of FIG. 1, the second interleaved converter is an interleaved buck converter 30, which, in the case of an aircraft power supply, may be about 32 VDC. The low-voltage DC at the output of the interleaved buck converter 30 is distributed to other portions of the aircraft on a low-voltage DC power bus. The interleaved converters 25, 30 may be operated at the same switching frequency or at different switching frequencies.

The power converter 15 also includes a control system 35 connected to receive a low-voltage, such as 12 VDC, from the low-voltage DC source 17. The control system 35 is configured to control: 1) the interleaved buck converter 30 to generate the regulated low-voltage DC; and 2) the interleaved full-bridge converter 25 to generate the high-voltage DC. Since each converter is an interleaved converter, the control system 35 may readily configure the voltage output levels to match the needs of the loads on the power buses of each interleaved converter. This may be accomplished by the control system 35 through adjustments to the PWM control signals for each interleaved converter 25, 30.

As noted, the converters 25 and 30 have interleaved topologies. The interleaved structures allow for a reduction in the sizes of the EMI filters used for each supply unit so that the power converter 15 can meet strict aircraft electromagnetic emission requirements. Still further, the weight of the power converter 15 is relatively low when interleaved structures for the individual supply units are used.

In FIG. 1, the output of the fuel cell 20 is provided to the input of a common EMI filter. The common EMI filter is common to both the interleaved full-bridge converter 25 and interleaved buck converter 30. This reduces its complexity and also results in a low weight.

The common EMI filter of the illustrated example includes a localized filter stage 50 and a distributed filter stage 55. The localized filter stage 50 is configured to receive DC power from the fuel cell 20. The localized filter stage 50 includes a plurality of filter elements that are located proximate one another. For example, the elements of the localized filter stage 50 may be disposed at the same portion of a circuit board that is common to other elements of power converter 15, such as the control system 35, the interleaved full-bridge converter 25, and/or the interleaved buck converter 30. Alternatively, the elements of the localized filter stage 50 may be disposed on a circuit board that is independent of the other elements of power converter 15.

The output of the localized filter stage 50 is configured to provide DC power to the distributed filter stage 55. In the example of FIG. 1, the distributed filter stage 55 includes a first set of common mode capacitors 60 electrically connected to and physically proximate input power lines of the interleaved full-bridge converter 25. The distributed filter stage also includes a second set of common mode capacitors electrically connected to and physically proximate input power lines of the interleaved buck converter 30.

Here, the first set of common mode capacitors 60 includes a first common mode capacitor 70 electrically connected to and physically proximate a positive power input line of the interleaved full-bridge converter 25. As shown, the first common mode capacitor 70 is further configured for connection between a positive output of the localized filter stage 50 and common ground. The first set of common mode capacitors 60 also includes a second common mode capacitor 75 electrically connected to and physically proximate a negative power input line of the interleaved full-bridge converter 25. The second common mode capacitor 75 is also configured for connection between a negative output of the localized filter stage 50 and the common ground.

The second set of common mode capacitors includes a third common mode capacitor 80 electrically connected to and physically proximate a positive power input line of the interleaved buck converter 30. As shown, the third common mode capacitor is also configured for connection between the positive output of the localized filter stage 50 and the common ground. Also, the second set of common mode capacitors includes a fourth common mode capacitor 85 electrically connected to and physically proximate a negative input power line of the interleaved buck converter 30. The fourth common mode capacitor 85 is further configured for connection between the negative output of the localized filter stage 50 and the common ground.

Figure 2:
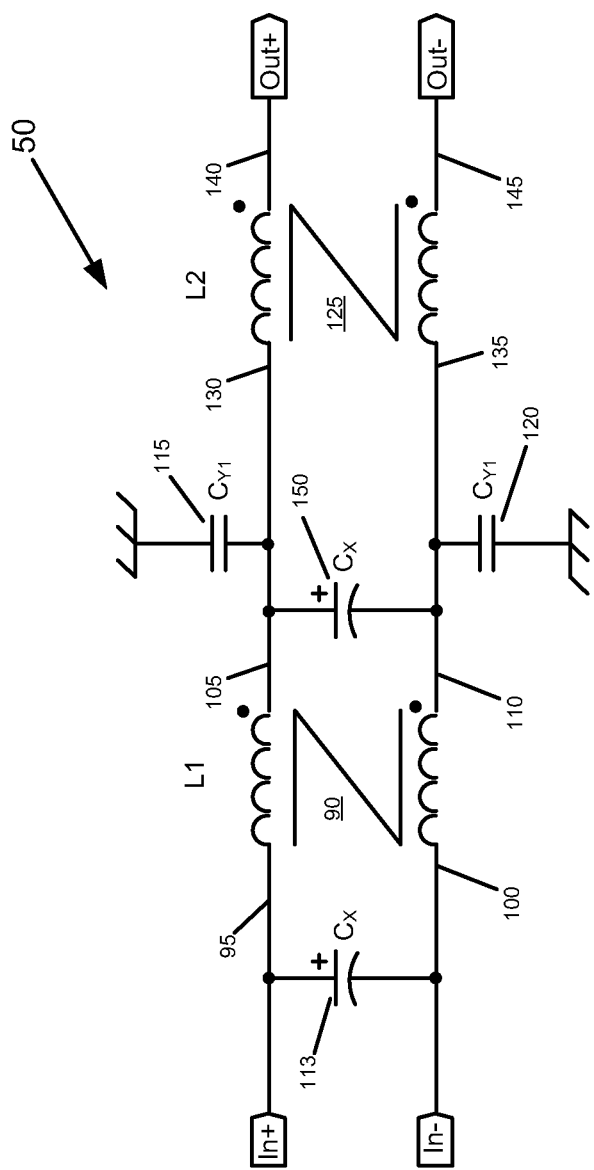
FIG. 2 is a schematic diagram of one example of the localized filter stage of a common EMI filter that may be used in the power system of FIG. 1.

One construction of a localized filter stage 50 is shown in FIG. 2. In this example, the localized filter stage 50 includes a first common mode choke 90 having a positive input 95, a negative input 100, a positive output 105, and a negative output 110. A first differential mode capacitor 113 is configured between the positive input 95 and negative input 100 of the first common mode choke 90. A first common mode capacitor 115 is configured between the positive output 105 of the first common mode choke 90 and common ground. A second common mode capacitor 120 is configured between the negative output 110 of the first common mode choke 90 and common ground.

The localized filter stage 50 also includes a second common mode choke 125 having a positive input 130, a negative input 135, a positive output 140, and a negative output 145. A second differential mode capacitor 150 is configured between the positive input 130 and negative input 135 of the second common mode choke 125. In this example, the positive output 140 and negative output 145 of the second common mode choke 125 define the outputs of the localized filter stage 50 that are provided to the input of the distributed filter stage 55.

Figure 3:
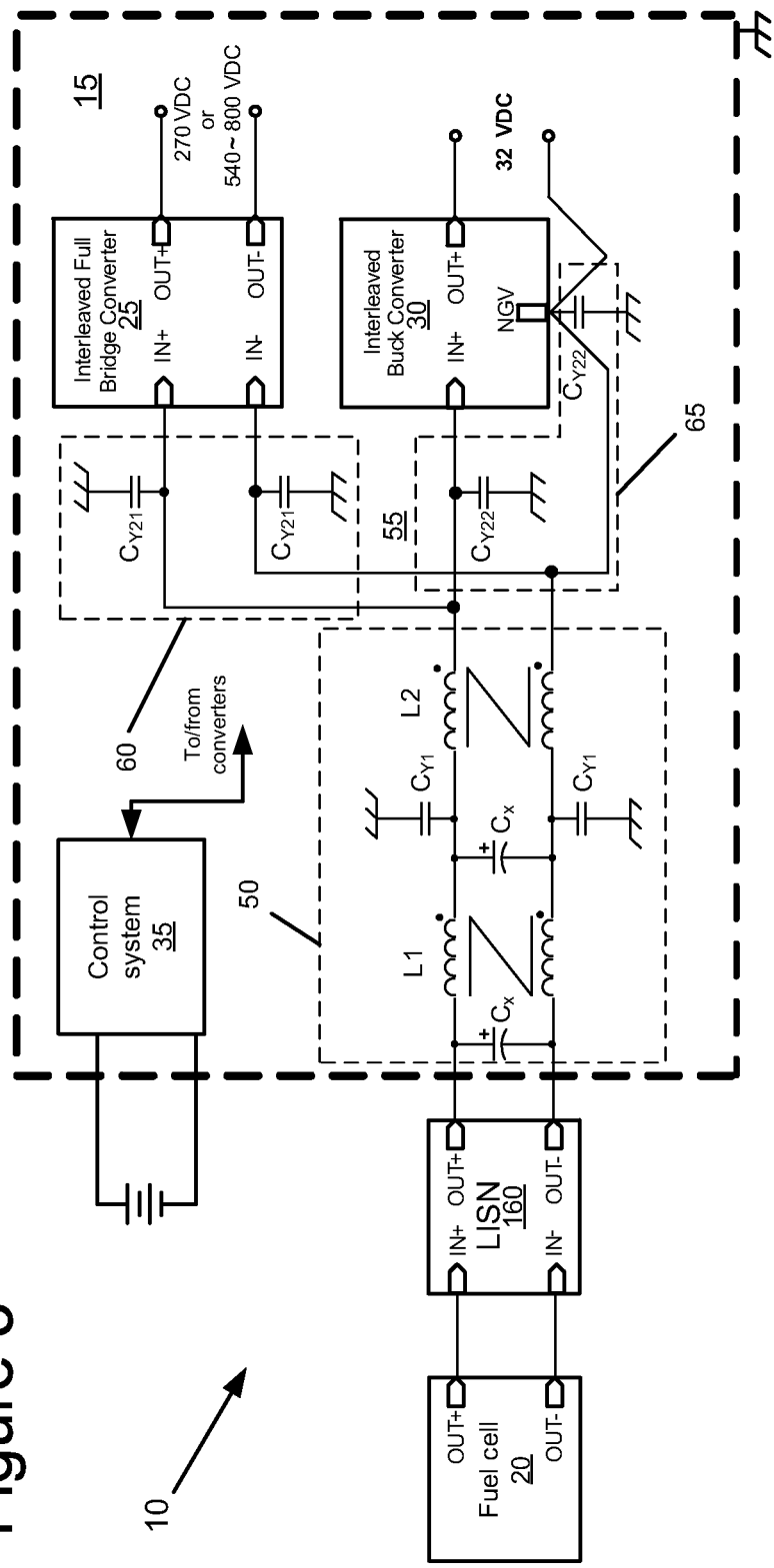
FIG. 3 is a block diagram of the power system of FIG. 1 including the localized filter stage of FIG. 2, where the power system is configured for measuring electromagnetic interference.

FIG. 3 is a block diagram of the power system 10, where the power converter 15 is configured as a unit under test. To this end, the fuel cell 20 is connected to a LISN 160 (line impedance stabilization network). The LISN 160 is a device used in conducted and radiated radio-frequency emission and susceptibility tests, as specified in various EMC/EMI test standards, such as those used for aircraft. The LISN 160 operates as a low-pass filter between the fuel cell 20 and the power converter 15 to create a known impedance and to provide an RF noise measurement port. It also isolates the unwanted RF signals from the fuel cell 20. Here, the output of the LISN 160 is provided to the input of the localized filter stage 50 for testing of the power converter 15. The power converter 15 in FIG. 3 uses the circuit topology shown in FIG. 2 for the localized filter stage 50.

Figure 4:
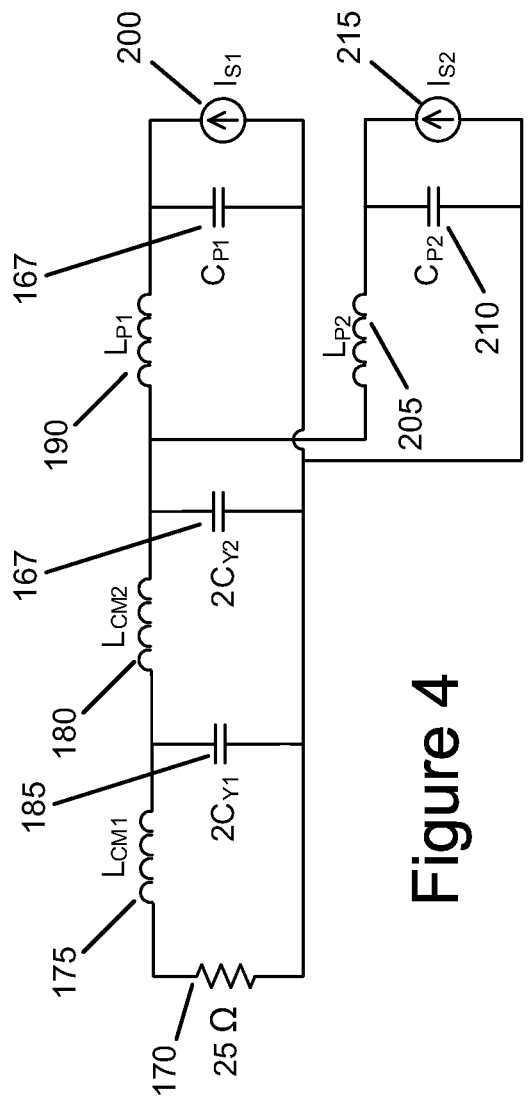
FIG. 4 is a schematic diagram of a standard EMI filter model that is simplified for common mode noise analysis.
Figure 5:
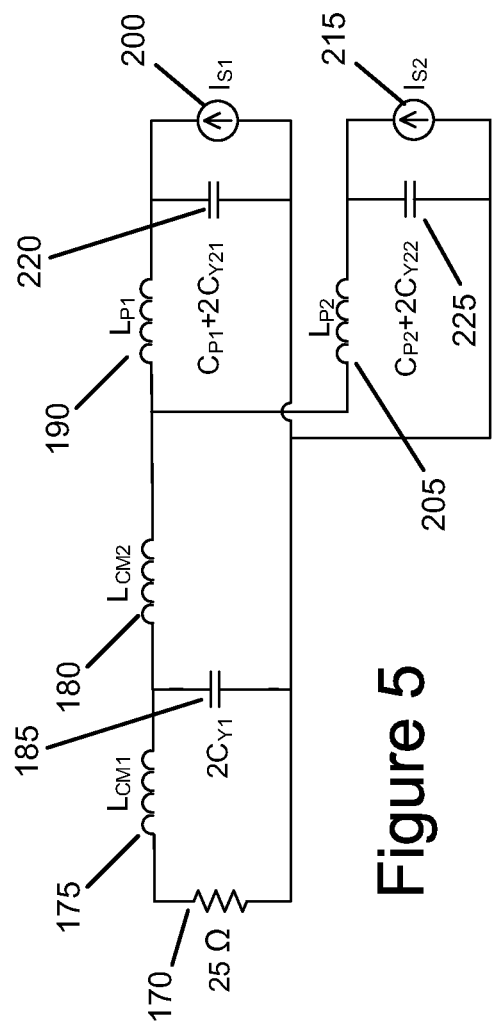
FIG. 5 is a simplified schematic diagram of a model of the common EMI filter elements and parasitic elements for the power system of FIG. 3 for common mode analysis, where the common mode capacitors are distributed so that they are disposed physically proximate and connected to the power inputs of the interleaved converters.

FIG. 4 is a schematic diagram of a standard EMI filter simplified model for common mode analysis. Unlike the common EMI filter used in FIG. 3, the standard EMI filter model does not have an equivalent to the common mode capacitors 70, 75, 80, and 85 of the distributed filter stage 55. Instead, a single capacitor 167 is locally disposed at the output of the standard EMI filter model with the other filter elements. For purposes of the following discussion, the capacitor 167 has a capacitance of $2C_{Y2}$, because it is representing two common mode capacitors, one between the positive line and common ground, and a second one between the negative line and common ground. FIGS. 4 and 5 are simplified models for common mode noise analysis, so instead of two capacitors, a single common mode capacitor is modeled with twice the capacitance value. In the example of FIG. 5, capacitor 185 represents a combination the capacitance values of capacitors 150 and 120 from FIG. 2.

The model of FIG. 4 also includes other filter elements. As shown, the model includes a resistor 170 used to represent the impedance at high frequencies of the LISN 160. A first inductor 175 has an inductance $L_{CM1}$ and represents the common mode inductance of the first common mode choke 90. A second inductor 180 has an inductance $L_{CM2}$ and represents the common mode inductance of the second common mode choke 125. The first and second common mode capacitors 115, 120 of the localized filter stage 50 are combined into a single capacitor 185 having a value of $2C_{y1}$ corresponding to the sum of the individual capacitances values $C_{y1}$.

The parasitic and noise elements between the common EMI filter and the interleaved full-bridge converter 25 are also modeled in FIG. 4. More particularly, the model includes an inductor 190 having an inductance $L_{P1}$ that represents the parasitic inductance of the conductors connecting the output of the common EMI filter with the inputs of the interleaved full-bridge converter 25. A capacitor 195 has a capacitance $C_{P1}$ corresponding to the parasitic capacitance between DC input of the converters and common ground. A current source 200 is used to represent the noise generated by the interleaved full-bridge converter 25 as a result of the PWM switching of the transistors of the interleaved full-bridge converter 25.

Still further, the parasitic and noise elements between the common EMI filter and the interleaved buck converter 30 are modeled in FIG. 4. More particularly, the model includes an inductor 205 having an inductance $L_{P2}$ that represents the parasitic inductance of the conductors connecting the output of the common EMI filter with the inputs of the interleaved buck converter 30. A capacitor 210 has a capacitance $C_{P2}$ representing the parasitic capacitance between DC input of the converters and common ground. A current source 215 is used to represent the noise generated by the interleaved buck converter 30 as a result of the PWM switching of the transistors of the interleaved buck converter 30.

FIG. 5 is a schematic diagram of a model of the common EMI filter elements and parasitic elements of the power system of FIG. 3, where the common mode capacitors of the distributed filter stage 55 are disposed physically proximate and connected to the power inputs of the interleaved converters. This arrangement of the elements is different from the model shown in FIG. 4. In FIG. 5, the capacitance $2C_{y2}$ has been removed from the standard EMI filter model and distributed as capacitors in parallel with the parasitic capacitors 195 and 210. To this end, the capacitor 220 across the current source 200 has a capacitance of $C_{P1}+2C_{Y21}$, and the capacitor 225 capacitance across the current source 215 has a capacitance of $C_{P2}+2C_{Y22}$. This distribution of the capacitance results in a circuit having a transfer function of with respect to current source 200, and a transfer function of with respect to current source 215. Approximations for the values of the parasitic inductors and parasitic capacitors may be used to derive values for the capacitors 220 and 225. In turn, these capacitor values may be used to construct the distributed filter stage 55 of the power converter 15. With the distributed filter capacitor, resonance between the capacitors and inductance of the connection cables is substantially reduced. For the schematic model shown on FIG. 5, both transfer functions, with respect to 200 and 215, are same and are plotted on FIG. 7.

Figure 6:
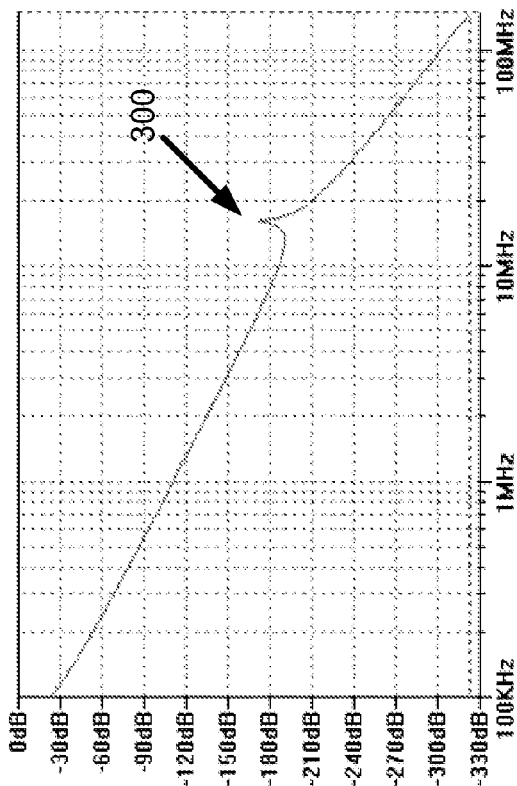
FIG. 6 is a graph of a simulation showing the magnitude versus frequency response at the input of a converter connected to a DC power source through a standard EMI filter.

FIG. 6 is a graph of a simulation showing the magnitude versus frequency response at the input of a connected to a DC power source through a standard EMI filter. As shown, the response includes a peak 300 resulting from the resonance of the parasitic capacitance and parasitic inductance seen by the converter input. Such a peak is undesirable and may prevent the system from meeting specified performance standards. Further, the magnitude of the peak 300 may vary under different load conditions thereby compromising the performance of the power system 10.

Figure 7:
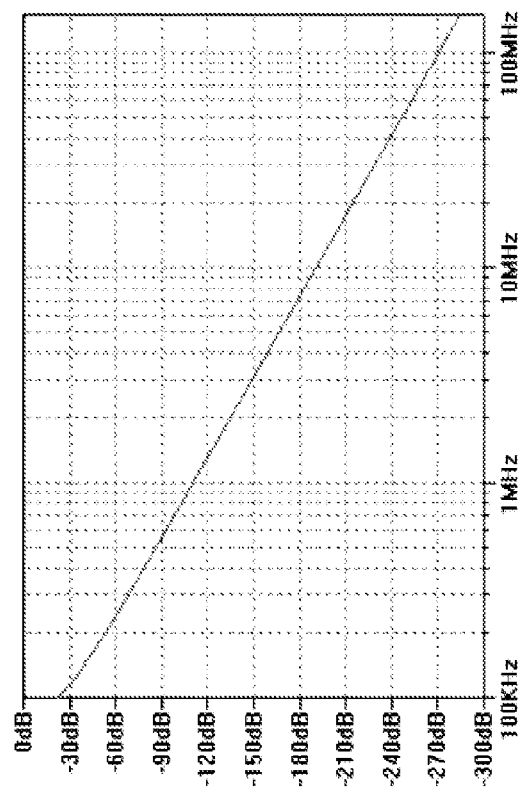
FIG. 7 is a graph of a simulation showing the magnitude versus frequency response at the input of a converter connected to a DC power source through the common EMI filter shown in FIG. 3.

FIG. 7 is a graph of a simulation showing the magnitude versus frequency response of a power system with the common EMI filter set forth above. Here, the simulation used the distributed common mode capacitors of the model shown in FIG. 5. Notably, the peak 300 has been eliminated. Further simulations have shown that such peaks may be controlled over a range of frequencies and load conditions to meet stringent EMI standards imposed on the aircraft industry.

The invention claimed is:

1. A power supply system comprising:
   a first interleaved power supply, wherein the first interleaved power supply is an X-phase interleaved full-bridge converter and X is a first number;
   a second interleaved power supply, wherein the second interleaved power supply is a Y-phase interleaved buck converter and Y is a second number; and
   a common electromagnetic interference filter configured to provide DC power from a DC power source to both the first interleaved power supply and the second interleaved power supply, wherein the DC power source provides a first voltage, the first interleaved power supply provides a second voltage, the second interleaved power supply provides a third voltage, and the first voltage, the second voltage, and the third voltage are DC voltages and are different from one another, wherein the common electromagnetic interference filter comprises:
      a localized filter stage configured to receive DC power from the DC power source; and
      a distributed filter stage configured to receive DC power from the localized filter stage, wherein the distributed filter stage includes a first set of common mode capacitors electrically connected to and physically proximate input power lines of the first interleaved power supply, the distributed filter stage further including a second set of common mode capacitors electrically connected to and physically proximate input power lines of the second interleaved power supply.

2. The power supply system of claim 1, wherein the first set of common mode capacitors comprises:
   a first common mode capacitor electrically connected to and physically proximate a positive power input line of the first interleaved power supply, wherein the first common mode capacitor is configured for connection between a positive output of the localized filter stage and a common ground; and
   a second common mode capacitor electrically connected to and physically proximate a negative power input line of the first interleaved power supply, wherein the second common mode capacitor is configured for connection between a negative output of the localized filter stage and the common ground.

3. The power supply system of claim 1, wherein the second set of common mode capacitors comprises:
   a third common mode capacitor electrically connected to and physically proximate a positive power input line of the second interleaved power supply, wherein the third common mode capacitor is configured for connection between a positive output of the localized filter stage and the common ground; and
   a fourth common mode capacitor electrically connected to and physically proximate a negative power input line of the second interleaved power supply, wherein the fourth common mode capacitor is configured for connection between a negative output of the localized filter stage and the common ground.

4. The power supply system of claim 1, wherein the localized filter stage comprises:
   a first common mode choke having a positive input, a negative input, a positive output, and a negative output;
   a first differential mode capacitor configured between the positive input and the negative input of the first common mode choke;
   a first common mode capacitor configured between the positive output of the first common mode choke and common ground;
   a second common mode capacitor configured between the negative output of the first common mode choke and common ground;
   a second common mode choke having a positive input, a negative input, a positive output, and a negative output;
   a second differential mode capacitor configured between the positive input and the negative input of the second common mode choke; and
   wherein the positive output and negative output of the second common mode choke define the outputs of the localized filter stage.

5. The power supply system of claim 1, wherein the first interleaved power supply and second interleaved power supply operate at a same switching frequency.

6. The power supply system of claim 1, wherein the first interleaved power supply and second interleaved power supply operate at different switching frequencies.

7. The power supply system of claim 1, wherein the common electromagnetic interference filter is configured to receive DC power from a fuel cell.

8. The power supply system of claim 1, wherein X=4 and Y=6.

9. A common electromagnetic interference filter configured to provide DC power from a DC power source to both a first interleaved power supply and a second interleaved power supply, the common electromagnetic interference filter comprising:
   a localized filter stage configured to receive DC power from the DC power source; and
   a distributed filter stage configured to receive DC power from the localized filter stage, wherein the distributed filter stage includes a first set of common mode capacitors electrically connected to and physically proximate input power lines of the first interleaved power supply, the distributed filter stage further including a second set of common mode capacitors electrically connected to and physically proximate input power lines of the second interleaved power supply, wherein the DC power source provides a first voltage, the first interleaved power supply provides a second voltage, the second interleaved power supply provides a third voltage, the first voltage, the second voltage, and the third voltage are DC voltages and are different from one another, the first interleaved power supply is an X-phase interleaved full-bridge converter, the second interleaved power supply is a Y-phase interleaved buck converter, X is a first number, and Y is a second number.

10. The common electromagnetic interference filter of claim 9, wherein the first set of common mode capacitors comprises:
   a first common mode capacitor electrically connected to and physically proximate a positive power input line of the first interleaved power supply, wherein the first common mode capacitor is configured for connection between a positive output of the localized filter stage and a common ground; and
   a second common mode capacitor electrically connected to and physically proximate a negative power input line of the first interleaved power supply, wherein the second common mode capacitor is configured for connection between a negative output of the localized filter stage and the common ground.

11. The common electromagnetic interference filter of claim 10, wherein the second set of common mode capacitors comprises:
   a third common mode capacitor electrically connected to and physically proximate a positive power input line of the second interleaved power supply, wherein the third common mode capacitor is configured for connection between the positive output of the localized filter stage and the common ground; and
   a fourth common mode capacitor electrically connected to and physically proximate a negative power input line of the second interleaved power supply, wherein the fourth common mode capacitor is configured for connection between the negative output of the localized filter stage and the common ground.

12. The common electromagnetic interference filter of claim 9, wherein the localized filter stage comprises:
   a first common mode choke having a positive input, a negative input, a positive output, and a negative output;
   a first differential mode capacitor configured between the positive input and the negative input of the first common mode choke;
   a first common mode capacitor configured between the positive output of the first common mode choke and common ground;
   a second common mode capacitor configured between the negative output of the first common mode choke and common ground;
   a second common mode choke having a positive input, a negative input, a positive output, and a negative output;
   a second differential mode capacitor configured between the positive input and the negative input of the second common mode choke; and
   wherein the positive output and negative output of the second common mode choke define the outputs of the localized filter stage.

13. A method of operating a power supply system comprising:
   providing DC power from a DC power source;
   receiving the DC power from the DC power source at a common electromagnetic interference filter; and
   providing DC power from the common electromagnetic interference filter to both a first interleaved power supply and a second interleaved power supply, wherein the DC power source provides a first voltage, the first interleaved power supply provides a second voltage, the second interleaved power supply provides a third voltage, the first voltage, the second voltage, and the third voltage are DC voltages and are different from one another, the first interleaved power supply is an X-phase interleaved full-bridge converter, the second interleaved power supply is a Y-phase interleaved buck converter, X is a first number, and Y is a second number, and wherein said providing DC power from the common electromagnetic interference filter comprises:
      providing DC power from a first filter stage to a second filter stage of the common electromagnetic interference filter; and operating the second filter stage using a first set of common mode capacitors electrically connected to and physically proximate input power lines of the first interleaved power supply, and further operating the second filter stage using a second set of common mode capacitors electrically connected to and physically proximate input power lines of the second interleaved power supply.

14. The method of claim 13, wherein said receiving the DC power from the DC power source comprises receiving DC power from a fuel cell.

15. The method of claim 13, wherein X=4 and Y=6.

* * * * *